United States Patent [19]

Blauschild

[11] 4,005,315

[45] Jan. 25, 1977

[54] TRIPLE STATE TO BINARY CONVERTER

[75] Inventor: Robert A. Blauschild, Sunnyvale, Calif.

[73] Assignee: Signetics Corporation, Sunnyvale, Calif.

[22] Filed: Sept. 22, 1975

[21] Appl. No.: 615,476

[52] U.S. Cl. .............................. 307/209; 307/236; 307/261; 307/299 B

[51] Int. Cl.[2] .................. H03K 19/28; H03K 19/08

[58] Field of Search ........ 307/209, 236, 261, 299 B

[56] References Cited

UNITED STATES PATENTS

| | | | |
|---|---|---|---|
| 3,213,294 | 10/1965 | Okuda | 307/209 |
| 3,461,390 | 8/1969 | Mack | 307/261 X |
| 3,476,879 | 11/1969 | Zenner | 307/236 X |
| 3,489,922 | 1/1970 | Lee | 307/236 |
| 3,497,723 | 2/1970 | Nelson | 307/261 |
| 3,914,628 | 10/1975 | Pao et al. | 307/236 X |

Primary Examiner—John S. Heyman
Attorney, Agent, or Firm—C. Richard Pfeiffer; William H. Dana

[57] ABSTRACT

A logic circuit for converting a triple state input to a binary output having a single line ternary input and a two line binary output. A pair of output transistors provide the two line binary output, and means are provided for driving both of these output transistors, such that three different binary output states result from the ternary input states of low, high and open (or floating), respectively.

8 Claims, 8 Drawing Figures

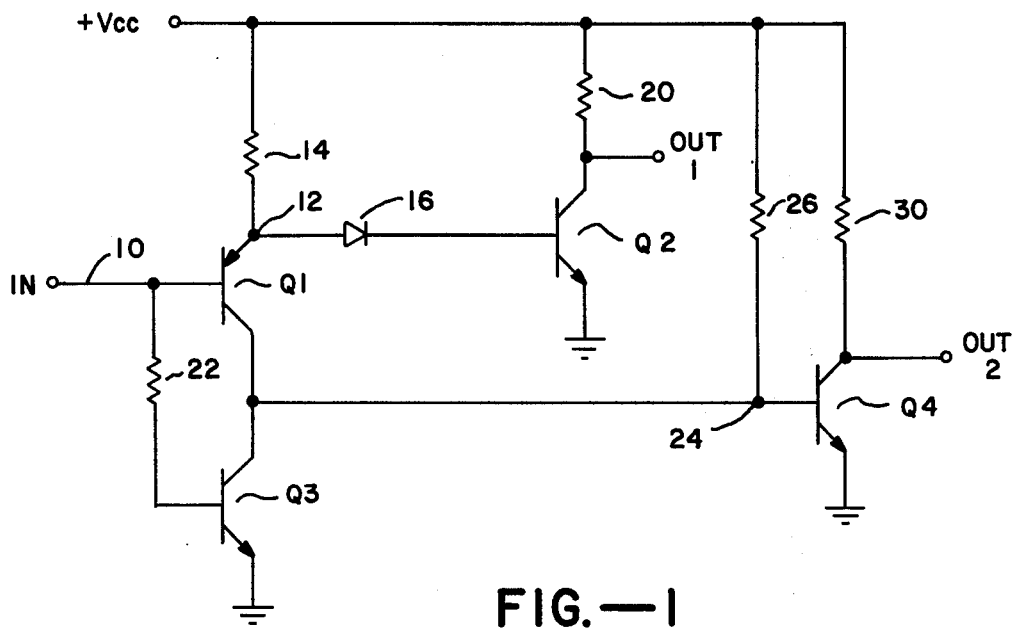
FIG.—1
| IN | OUT 1 | OUT 2 |
|---|---|---|
| FLOAT | 0 | 0 |
| 1 | 0 | 1 |
| 0 | 1 | 0 |
FIG.—2
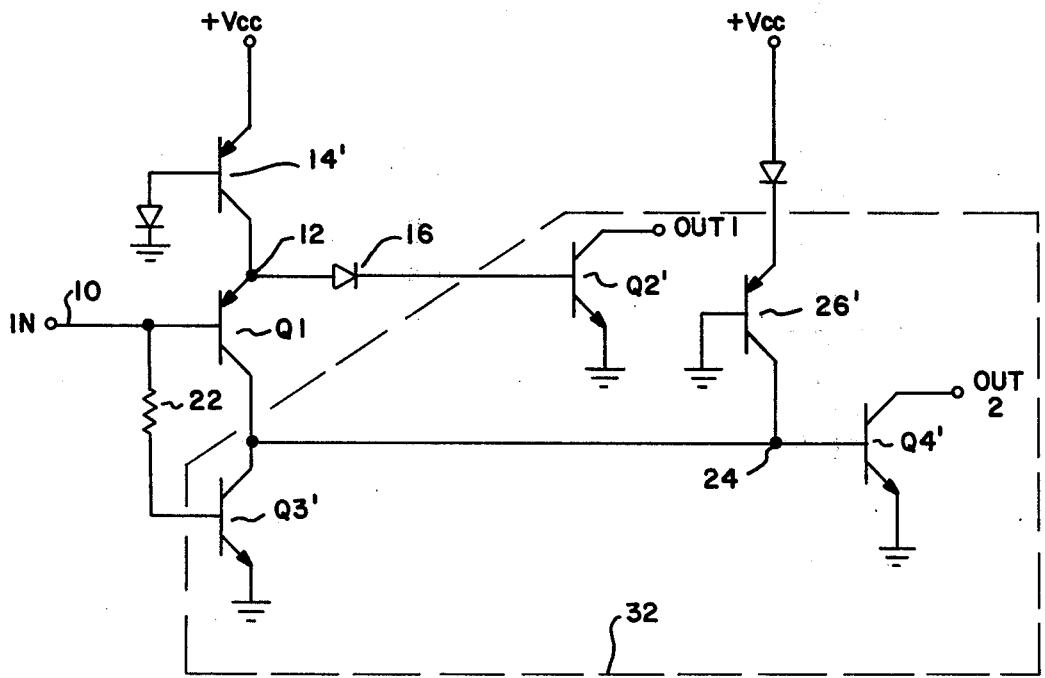
FIG.—3

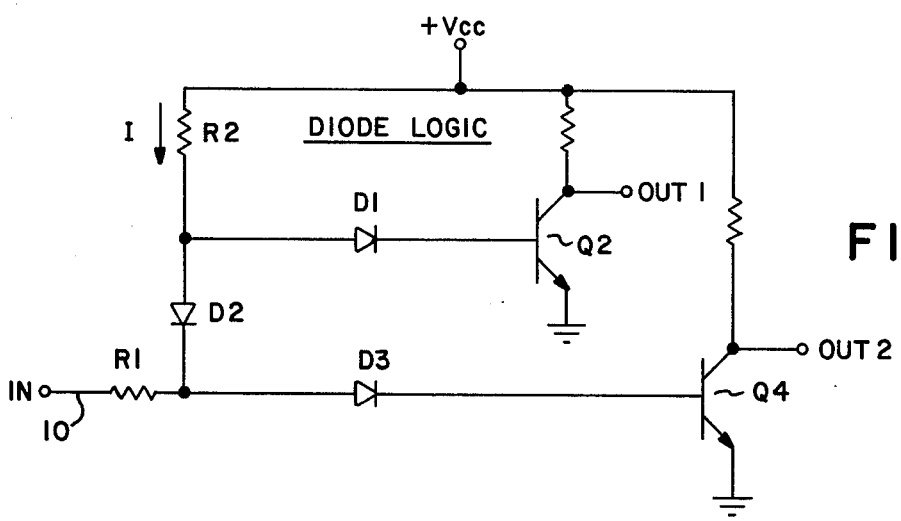
FIG.—4A
FIG.—4B
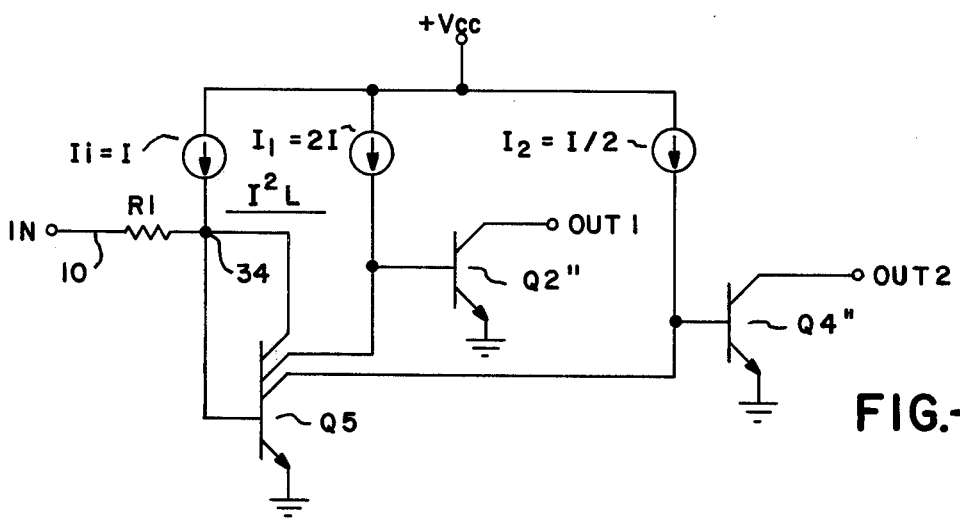
FIG.—5A
FIG.—5B
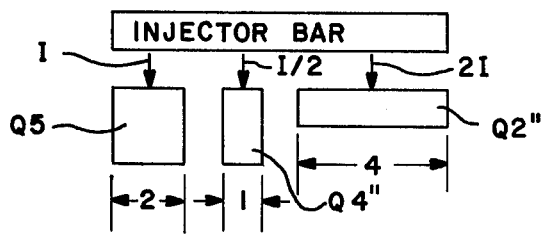
FIG.—5C

TRIPLE STATE TO BINARY CONVERTER

BACKGROUND OF THE INVENTION

The present invention is directed to a logic circuit having a single three state input with a pair of binary outputs.

A semiconductor device using conventional binary coding uses a number of input lines, each of which may be in one of two logic states, 0 or 1. The number of input lines determines the number of different possible input states. For n input lines using binary coding, $2^n$ different input states may be defined.

To increase the number of input states additional input lines are necessary. This requires a considerable amount of space in the semiconductor device for connecting pins and bonding pads. The size of semiconductor devices is a prime consideration in their design and application. A substantial savings in the space required for the pins and pads could be effected by a device which required fewer input lines.

Devices are disclosed in Aoki U.S. Pat. No. 3,602,703 and Kane patent 3,697,775 which produce three distinct output logic states (0, 1 and floating) on a single line. The number of different input states which may be determined by such ternary coding is greater than that possible by binary coding. For n input lines using such ternary coding, a total of $3^n$ different input states may be defined.

OBJECTS AND SUMMARY OF THE INVENTION

It is, therefore, an object of the present invention to provide a logic circuit which can accept a one line ternary input signal and convert the same to a two bit binary output signal.

In accordance with the above object a triple state to binary converter is provided having a one line ternary input and a two line binary output. The output has four possible binary states and provides two of such states in response to a low or high input and a third of such states in response to an open or floating condition of said input. The converter comprises a pair of output transistors for providing the two line binary output. Logic level means sense the low, high and floating input conditions and distinguish between such conditions to drive the transistor pair to provide a unique one of the three states for each of the input conditions.

BRIEF DESCRIPTION OF THE DRAWINGS

FIG. 1 is a circuit diagram of one embodiment of the present invention;

FIG. 2 is a truth table for FIGS. 1 and 3;

FIG. 3 is a circuit diagram of another embodiment;

FIG. 4A is a circuit diagram of another embodiment of the invention;

FIG. 4B is a truth table for FIG. 4A;

FIG. 5A is a circuit diagram of another embodiment of the invention;

FIG. 5B is a truth table for FIG. 4B; and

FIG. 5C is a simplified I²L circuit of a portion of FIG. 5A.

DETAILED DESCRIPTION OF THE PREFERRED EMBODIMENTS

The circuit of FIG. 1 allows three different logic state inputs to be applied to a single input line 10 and converts this input signal to a two line binary output, OUT 1 and OUT 2, for further processing.

Input line 10 is connected to the base of transistor Q1. The emitter of Q1 is connected to node 12 which is further connected to +V through resistor 14 which therefore acts as a current source. Node 12 is also connected through series diode 16 to the base of a transistor Q2. The collector of Q2 is connected to OUT 1 and is also connected to +V through a resistor 20. Output 1 constitutes one of the two lines of the binary output of the converter.

Input line 10 is also connected through resistor 22 to the base of a transistor Q3. The collector of Q1 and the collector of Q3 are commoned and connected to node 24 which is further connected to the base of a transistor Q4. Node 24 is connected to +V through resistor 26. The collector of Q4 is connected to OUT 2 and is further connected to +V through a resistor 30.

Input line 10 may be in any one of three different logic states: ground (low), +V (high), or floating (not connected or high impedance). When the input is tied to ground, the on condition of transistor Q1 clamps node 12 to a voltage which is below the turn on voltage of both diode 16 and transistor Q2. Thus, Q2 is off and OUT 1 is therefore high. Since the input is at ground, transistor Q3 is off and Q4 therefore saturates through resistor 26 which acts as a current source and causes OUT 2 to be low. Thus, OUT 1 and OUT 2 are respectively high and low for an input state of ground.

When input line 10 is at +V, Q1 is off and Q2 saturates through resistor 14, which acts as a current source, and diode 16 and causes OUT 1 to be low. Q3 then saturates through resistor 22, which acts as a current source, and causes node 24 to be below the turn on voltage of transistor Q4. Q4 is, therefore, off and output 2 is high. Thus the output lines 1 and 2 are respectively low and high when input line 10 is high.

When input line 10 is left open or in a floating state, Q2 saturates through resistor 14 and diode 16. The off condition of transistor Q1 and the diode 16 and base emitter drop of Q2 clamp node 12 to a high state. Transistor Q3 is slightly on but its collector current and base current are supplied by Q1. Therefore, transistor Q4 is allowed to saturate through resistor 26 which acts as a current source. Since transistor Q2 is saturated, OUT 1 is low. Since transistor Q4 is saturated, OUT 2 is also low. Therefore, the output lines are both low when input line 10 is in a floating state.

In FIG. 2, a truth table is shown in which the above-mentioned relationships between input line and output lines is described.

Referring now to FIG. 3, this circuit modifies the circuit of FIG. 1 by utilizing integrated injection logic (I²L). I²L logic is also known as collector-up logic. Specifically transistors Q2', Q3' and Q4' are in an I²L configuration along with the remaining components in dashed block 32. Resistor 14 in FIG. 1 is replaced with a PNP current source 14' in FIG. 3, and resistor 26 in FIG. 1 is replaced with a similar PNP current source 26'. Since the active operation of these resistors as described above is to serve as current sources, the circuit operation of FIG. 3 is essentially the same as that of FIG. 1. These changes allow for further area savings in the die size required for the circuit.

An alternative embodiment of FIG. 1 is illustrated in FIG. 4A along with the associated truth table of FIG. 4B which is a simpler and smaller circuit. However, instead of the transistors Q1 and Q3 of FIG. 1 it utilizes diodes exclusively for driving transistor output pair Q2, Q4. In essence, the diodes D1, D2 and D3 constitute logic level means for sensing the low, high and floating input voltage conditions. Specifically, the high voltage condition is greater than $2V_{be}$ where $V_{be}$ is the standard base to emitter voltage drop and the low condition is defined as being less than $V_{be}$.

Diode D1 is series connected to the base of Q2 and D3 is series connected to the base of Q4. The cathode of a diode D2 is connected to D3 and to the input 10 through a resistor R1. The common anodes of D1 and D2 are connected together and the resistor R2 which in turn is connected to $V_{cc}$ and thus serves as a current source, I. Such current source tends to maintain Q2 in an on condition or in other words, out 1 is low unless there is some counter bailing effect on the input 10.

Referring also to the truth table of FIG. 4B the operation of the circuit of FIG. 4A is as follows. With the input in a 1 condition, that is greater than $2V_{be}$, current flows from the input through diode D3 providing a base drive to transistor Q4 placing it in an on condition and putting output 2 low or zero. Current source I flows through D1 providing base drive to Q2 placing it in an on condition and pulling output 1 low or zero.

With the input less than $V_{be}$ or in a zero state, (in other words, grounded) D3 and the base emitter junction of Q4 are biased below the turn on voltage cutting off Q2 and causing a high or one to occur at output 2. The common anodes of D1 and D2 are biased below $2V_{be}$ thus cutting off Q2 and causing a high or one at output 1.

With the input floating or open, D1 and the base emitter junction of Q2 clamp the common anodes of D1 and D2 to $2V_{be}$ since Q2 is conducting due to the action of the current; thus output 1 is low or zero. This also cuts off Q4 and thus output 2 is high or one.

The input resistor R1 is for current limiting protection when the input is connected to a voltage in excess of $2V_{be}$. The foregoing circuit of FIG. 4A is a voltage level sensitive circuit in that the conditions for the open, low and high states are nearly adjacent.

As opposed to the voltage level circuit of FIG. 4A a current threshold detector is illustrated in FIG. 5A which has improved noise margins and moreover, can be fabricated with integrated injection logic ($I^2L$) as opposed to the diode logic of FIG. 4A. In general, current threshold logic is more fully described in a copending application in the name of Tich T. Dao et al, entitled "Threshold Integrated Injection Logic" Ser. No. 591,400 filed June 30, 1975, assigned to the present assignee.

The entire circuit of FIG. 5A is in $I^2L$ format and includes the pair of output transistors Q2" and Q4" which respectively have injection current means $I_1 = 2I$ and $I_2 = I/2$. The bases of these transistors are connected to a multiple collector $I^2L$ transistor Q5 which has its third collector connected back to its base input. The base input also has an injection current means for providing injection current $I_t = I$. The base is also connected through a resistor R1 to the input 10. The various injection currents have relative magnitudes as illustrated where current to the base of Q2" is twice the injection current to the base of Q5 and the current to the base of Q4" is one-half the injection current $I_t$. These values provide substantial operating margins. In general, however, $I_1$ must be somewhat greater than $I_t$ and $I_2$ somewhat less than $I_t$ as will be apparent from the description of the operation below.

The connection of one collector of Q5 back to its base provides, as discussed in the foregoing Dao copending application, a normalization of Q5 so that the mirror image of the current flowing in the one collector connected back to its base is imposed on the other two collectors. In other words, the input current to the node 34 is substantially reproduced in the other collectors connected to Q2" and Q4". This mirror image operation occurs because of the unitary construction of Q5 in that there is a common base and emitter and the structure is symmetric.

In operation with the input 10 grounded or in a zero condition, outputs 1 and 2 are also grounded or zero. This occurs since the $I_1$ current source is drained off through protection resistor R1 through ground. Therefore, Q5 is off. Thus, the outputs 1 and 2 and their associated transistors Q2" and Q4" are both driven to a conductive state by the respective injection currents to provide zero or low conditions. The circuit will function in this state as long as the driving circuit can sink more than $I/2$.

With the input source high meaning a one condition where the input is sourcing current greater than I, the current at node 34 is greater than $2I$ (since $I_t = I$). The other collector currents of Q5 can therefore sink this amount and thus the entire output of the $2I$ and $I/2$ sources are diverted through Q5 turning off Q2" and Q4". Thus, both outputs are high or 1.

With the input floating the $I_t$ current source and its current value I is mirrored by the two collector circuits of Q5. Q5 thus sinks only half of $2I$ to place Q2" in a conductive state and thus output 1 is low. On the other hand all of the base drive current $I/2$ of Q4" is diverted to place Q4" off and out 2 in a high state.

In summary the circuit of FIG. 5A responds to three different current input levels where the floating condition is in essence an intermediate level causing Q2" to be on and Q4" to be off, a high condition where the input current is greater than the quantity ($I_1 - I_t$) places both output transistor pair in a nonconductive or off condition and a grounded input or low diverts $I_t$ so that both output transistors are in an off condition.

FIG. 5C illustrates the physical construction of the $I^2L$ circuit to produce the various injection current relationships. This is accomplished by varying the relative width of the base circuits for the various transistors in accordance with teachings of the above copending Dao application.

System resolution may be greatly enhanced by the use of ternary coded inputs, over binary coded inputs, on an equivalent number of input lines. For example, to define 1000 different states, ten binary-coded input lines are required, but only seven ternary-coded lines; 10,000 states can be defined by fourteen binary lines, or nine ternary lines.

The savings in input lines which can be realized, and the enhanced system resolution for the same number of input lines, over binary coding, is thus readily apparent. As the number of input states to be defined becomes successively larger, the use of binary coding may be precluded because of the impracticality of using a massive number of input lines.

Thus, a semiconductor device utilizing ternary coding on its input lines may realize a savings in the number of such input lines which is required for a particular desired resolution. Since ternary coded information is not generally amenable to immediate processing, however, a converter must be included within the semiconductor device to convert ternary signals to binary signals, for further processing. The present invention provides such converter. Although this increases the die size of the semiconductor device, this increase is more than offset by the reduced number of connector pins and bonding pads.

What is claimed is:

1. A triple state to binary converter having a one line ternary input and providing a two line binary output from a single polarity voltage supply, said output having four possible binary states and providing two of such states in response to a low or high input and a third of such states in response to an open or floating condition of said input, said converter comprising: a pair of output transistors connected to operate exclusively from a single fixed polarity voltage supply for providing said two line binary output; and logic level means connected to said supply for sensing said low, high and floating input conditions, and distinguishing between such conditions to drive said transistor pair to provide a unique one of said three states for each of said input conditions.

2. A converter as in claim 1 where said logic level means includes voltage sensitive diode means comprising a diode connected between the bases of said transistor pair for providing conduction in said pair when a first predetermined input condition level is exceeded, and for preventing input condition conduction in said pair below a second lower predetermined level and including current source means for driving only one of said transistors into conduction when said input condition is floating.

3. A triple state to binary converter having a one line ternary input and a two line binary output, said output having four possible binary states and providing two of such states in response to a low or a high input and a third of such states in response to an open or floating condition of said input, said converter comprising: a pair of output transistors for providing said two line binary output; and logic level means including voltage sensitive diode means connected to the bases of said transistor pair for providing conduction in said pair when a first predetermined input condition level is exceeded, and for preventing input condition conduction in said pair below a second lower predetermined level and including current source means for driving only one of said transistors into conduction when said input condition is floating for sensing said low, high and floating input conditions, and distinguishing between said conditions to drive said transistor pair to provide a unique one of said three states for each of said input conditions and where said diode means further includes a first diode series connected between said input and the base of one of said transistor pair, second and third back-to-back diode series connected between said input and the base of said other of said transistor pair, said current source means being connected to the back-to-back connection of said second and third diodes.

4. A triple state to binary converter having a one line ternary input and providing a two line binary output, said output having four possible binary states and providing two of such states in response to a low or high input and a third of such states in response to an open or floating condition of said input, said converter comprising: a pair of output transistors for providing said two line binary output; and logic level means for sensing said low, high and floating conditions, and distinguishing between such conditions to drive said transistor pair to provide a unique one of three states for each of said input conditions and where said logic level means further includes current sensitive means including an integrated injection logic ($I^2L$) transistor having three collectors one of which is connected back to its base and to an input injection current means for providing a base input current, $I_i$, said other two collectors being connected respectively to current injection means, $I_1$ and $I_2$ where $I_1 > I_i$ and $I_2 < I_i$ said two collectors also being connected to respective bases of said transistor pair, said input condition of high being $> (I_1 - I_i)$.

5. A converter as in claim 4 where said input injection means, $I_i$, and current injection means, $I_1$ and $I_2$, include an integrated injection logic ($I^2L$) circuit having an injector bar adjacent base portions of three transistors with respective base widths corresponding to the relative value of the injection currents, $I_i$, $I_1$, and $I_2$.

6. A triple state to binary converter having a one line ternary input and a two line binary output, said output having four possible binary states and providing two of such states in response to a low or high input and states in response to an open or floating condition of said input, said converter comprising: a pair of output transistors for providing said two line binary output, means for driving one of said transistor pair including a first current source and a series diode, where said diode is connected between the base of said one transistor and a third transistor, means for driving the other of said transistor pair including a second current source to bias said other transistor normally on said second current source being connected to the base of said other transistor, a fourth transistor connected to the base of said other transistor said one line ternary input comprising a single input line connected to the bases of said third and fourth transistors, said third and fourth transistors being of opposite conductivity type.

7. A converter as in claim 6 wherein said first current source comprises a resistor connected between a voltage source and the emitter of said third transistor, and wherein said second current source comprises another resistor connected between said voltage source and said base of said other transistor in said pair of output transistors.

8. A converter as in claim 6 wherein said first current source comprises a PNP transistor connected between a voltage source and the emitter of said third transistor and a diode connected between the base of said PNP transistor and ground; and wherein said second current source comprises one other PNP transistor and one other diode, with said other diode connected between said voltage source and the emitter of said other PNP transistor, and with the base and collector of said other PNP transistor connected to ground and said base of said other transistor in said pair of output transistors, respectively.

* * * * *